United States Patent [19]

Saita et al.

[11] Patent Number: 4,974,227
[45] Date of Patent: Nov. 27, 1990

[54] LOW-PRESSURE MERCURY RESONANCE RADIATION SOURCE

[75] Inventors: Masahiro Saita, Zushi; Dai Sugimoto, Yokohama; Masami Eishima, Chigasaki; Shuzo Hattori, Aichi; Yoshiyuki Uchida, Nagoya, all of Japan; George J. Collins, Fort Collins, Colo.

[73] Assignee: Nippon Seiko Kabushiki Kaisha, Tokyo, Japan

[21] Appl. No.: 421,992

[22] Filed: Oct. 16, 1989

[51] Int. Cl.$^5$ .................................................. H01S 3/13
[52] U.S. Cl. ..................................... 372/29; 372/69; 372/109; 372/33
[58] Field of Search ...................... 372/29, 69, 109, 33

[56] References Cited

PUBLICATIONS

Hattori et al; "Stabilized Monochromatic Radiation Source Using the Mercury Resonance Line (2537 å)"; Phys. D: Appl. Phys., vol. 3, 1970 (printed in Great Britain).

Primary Examiner—Léon Scott, Jr.
Attorney, Agent, or Firm—Frishauf, Holtz, Goodman & Woodward

[57] ABSTRACT

A low-pressure mercury resonance radiation source includes a discharge lamp containing mercury vapor and producing broad band radiation directly emitted from the mercury vapor through excitation of same by electric discharge, and a resonance cell containing mercury vapor and disposed adjacent the discharge lamp for absorbing the broad band radiation and reemitting narrow band mercury resonance radiation. The pressure of the mercury vapor within the resonance cell is controlled to a first predetermined value by controlling the temperature of a first mercury sump arranged within the resonance cell, and the pressure of the mercury vapor within the discharge lamp is controlled to a second predetermined value, preferably by controlling the temperature of a second mercury sump arranged in a side tube communicating with the discharge lamp.

9 Claims, 4 Drawing Sheets

LOW-PRESSURE MERCURY RESONANCE RADIATION SOURCE

BACKGROUND OF THE INVENTION

The present invention relates to a monochromatic radiation source for use in optical processing of materials, e.g. lithography in the manufacture of semiconductors, and more particularly to a low-pressure mercury resonance radiation source utilizing the atomic mercury resonance line.

As a monochromatic radiation source, an excimer laser has recently been attracting attention. In molecular physics an excimer means a dimer molecule produced by polymerization of two atoms or molecules in which are bound together an atom or molecule in the excited state and an atom or molecule in the ground state. In particular, if a mixture of a rare gas and a halogen gas is excited by an electron beam or an electric discharge, an excimer is produced, and narrow band radiation is emitted when the excimer, which is in the excited state, returns to the ground state which subsequently dissociates. For example, an excimer laser (hereinafter referred to as "the Kr-F laser") using a combination of krypton (Kr) and fluorine (F) emits narrow band radiation having a central wavelength of 248 nm.

An ideal radiation source for use in lithography is characterized by an ultra narrow energy half-width of the emitted radiation. This characteristic reduces adverse chromatic aberration affects in an optical lens system receiving and transmitting the radiation from the radiation source. In the case of the wavelength of 248 nm, the energy half width expressed in nanometers must be reduced to approximately 0.003 nm. However, this has not been realized yet in the aforesaid Kr-F laser.

Further, since the duration of the excited state of an excimer in the excimer laser is as short as a few nano seconds, a laser beam is emitted in the form of a pulsed radiation by repetition of electric discharge using capacitors at a constant frequency (e.g. 200 Hz). Therefore, in order to properly expose with the proper photon dose a resist coated on a material to be processed, it is necessary to control both the individual laser beam pulses and the pulse-to-pulse repeatibility. This makes the exposure apparatus more intricate. Moreover, the pulses exciting the laser form a propagating electromagnetic wave, which is liable to adversely affect both the microelectronic and optical devices associated with the output laser pulse control apparatus.

Alternatively, monochromatic radiation may be obtained by filtering a radiation source having a plurality of spectra, which is generated for example by a mercury-xenon lamp, a xenon lamp, a low-pressure mercury lamp, or a like lamp. However, this method suffers from the problem of a large amount of energy being lost in the filtration and hence low efficiency.

Two of the present inventors previously proposed a monochromatic radiation source using the mercury resonance line (J. Phys. D, 1970, Vol. 3, pp. 607–610). This monochromatic radiation source employs both a mercury-argon discharge lamp and a mercury resonance cell combined in a single unit. This apparatus selectively emits ultraviolet radiation having a wavelengh in the vicinity of 253.7 nm by sequentially generating broad band radiation in the discharge lamp and introducing it into the resonance cell where it is absorbed selectively and reemitted in a narrow band.

However, this prior art ultraviolet radiation source has the disadvantage that the pressure of mercury vapor contained in the discharge lamp cannot be controlled, so that an undesired arc discharge frequently occurs, which results in wear of the electrodes and unstable intensity of the emitted radiation.

SUMMARY OF THE INVENTION

It is the object of the invention to provide a low-pressure mercury resonance radiation source which is capable of properly controlling the discharge in the discharge lamp to thereby reduce the wear of the electrodes and further stabilize the intensity of the emitted radiation.

To attain the above object, according to a first aspect of the invention, there is provided a low-pressure mercury resonance radiation source including a discharge lamp containing mercury vapor and producing broad band radiation directly emitted from the mercury vapor through excitation of same by electric discharge, a resonance cell containing mercury vapor and disposed adjacent the discharge lamp for absorbing the broad band radiation and subsequently emitting narrow band mercury resonance radiation, and first pressure control means for controlling pressure of the mercury vapor within the resonance cell to a first predetermined value. The first aspect of the invention is characterized by comprising second pressure control means for controlling pressure of the mercury vapor within the discharge lamp to a second predetermined value.

Preferably, the first pressure control means comprises a first mercury sump arranged within the resonance cell, and first temperature control means for controlling temperature of the first mercury sump, and the second pressure control means comprises a side tube communicating with the discharge lamp, a second mercury sump arranged in the side tube, and second temperature control means for controlling temperature of the second mercury sump.

Further preferably, the resonance cell is substantially in the form of a hollow cylinder, the first predetermined value of the pressure of the mercury vapor being determined in accordance with an inner diameter of the hollow cylinder.

More preferably, the first predetermined value of the pressure of the mercury vapor is in a range of $10^{-4}$ to $10^{-3}$ Torr, and the second predetermined value of the pressure of the mercury vapor is in a range of $10^{-3}$ to $10^{-2}$ Torr.

Further preferably, the mercury vapor within the resonance cell comprises mercury atoms having a mass number of 200 and mercury atoms having a mass number of 202.

According to a second aspect of the invention, there is provided a low-pressure mercury resonance radiation source comprising:

a pair of cathode plates opposed to each other and each having a through hole formed in a central portion thereof;

a tube extending through the through holes of the cathode plates and defining a resonance cell therein, the resonance cell containing mercury vapor having a first predetermined pressure;

an anode interposed between the cathode plates in a manner insulated therefrom, the anode surrounding the tube in spaced relation thereto, the anode defining an electric discharge chamber together with the cathode plates and the tube, the electric discharge chamber containing mercury vapor having a second predetermined pressure; and a power source for applying voltage across the anode and the cathode plates.

Preferably, the low-pressure mercury resonance radiation source includes a first mercury sump formed within the resonance cell, a side tube communicating with the electric discharge lamp, the side tube having a second mercury sump, first temperature control means for controlling temperature of the first mercury sump, and second temperature control means for controlling temperature of the second mercury sump.

The above and other objects, features, and advantages of the invention will become more apparent from the ensuing detailed description taken in conjunction with the accompanying drawings.

DETAILED DESCRIPTION

An embodiment of the invention will now be described in detail with reference to the drawings.

Figure 1:
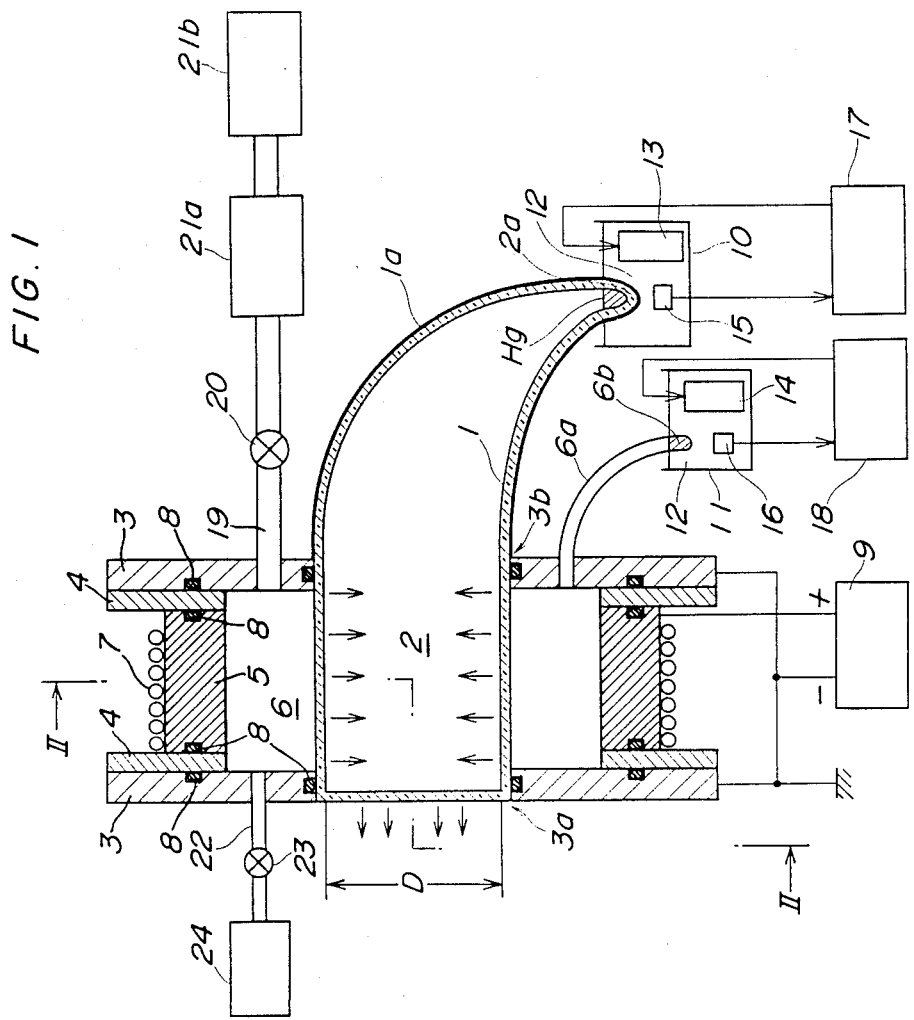
FIG. 1 is a schematic diagram of the whole arrangement of a low-pressure mercury resonance radiation source according to the invention, in which essential parts thereof are shown in cross section.
Figure 2:
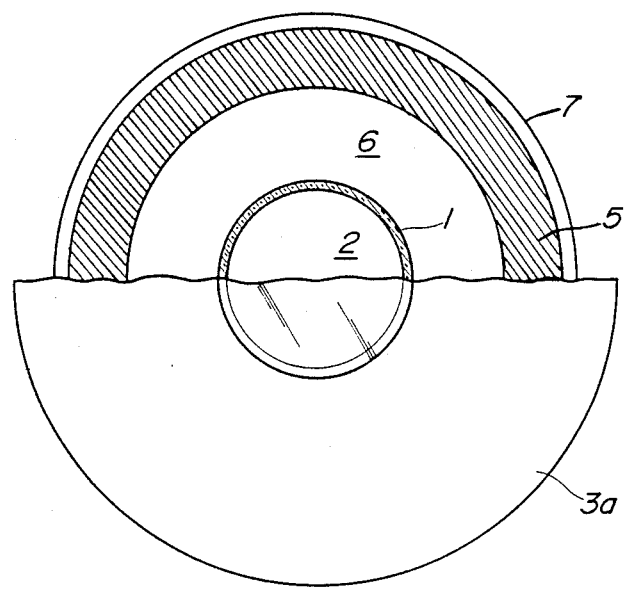
FIG. 2 is a cross-sectional view taken along the line II—II of FIG. 1.

FIG. 1 shows the whole arrangement of a low-pressure mercury resonance radiation source according to the invention, and FIG. 2 shows a cross section along the line II—II of FIG. 1. Preference numeral 1 indicates a quartz tube defining therein a resonance cell 2. The quartz tube 1 has a mercury (Hg) sump 2a which forms part of the resonance cell 2.

Two opposed cathode plates (formed e.g. of stainless steel SUS 304) 3 have respective through holes 3a, 3b formed therein through which the quartz tube 1 extend. Interposed between the two cathode plates 3 is a cylindrical anode (formed e.g. of stainless steel SUS 304, SUS 312, or SUS 316) 5 through annular insulators (formed e.g. of Al$_2$O$_3$ with a thickness of 9 mm) 4. An electric discharge cell (discharge lamp, electric discharge chamber) 6 is defined by the quartz tube 1, cathode plates 3, insulators 4, and anode 5. A side tube 6a having a mercury sump 6b at its closed end communicates with the electric discharge cell 6, while a diffusion pump 21a and a rotary pump 21b are also connected thereto by way of a conduit 19 and a valve 20. Further, an argon gas cylinder 24 is connected to the cell 6 by way of a conduit 22 and a valve 23. Around the anode 5 is arranged a coolant tube (formed e.g. of stainless steel SUS 304 or Cu) 7 for cooling the whole radiation source (particularly the electric discharge cell), which is insulated with respect to ground at its upstream and downstream ends. In order to keep airtight the electric discharge cell 6, O rings 8 are provided at places where the quartz tube 1 is in contact with the respective cathode plates 3, places where the insulators 4 are in contact with the respective cathode plates 3, and places where the anode 5 is in contact with the respective insulators 4.

The cathode plates 3 are grounded together with an earth terminal of a high voltage power source 9, while the anode 5 is connected to an output terminal of the high voltage power source 9. The output voltage of the power source 9 is e.g. 5 KV, and the output current thereof is variable within a range of 2 to 3 A.

In order to control the temperature of the mercury sump 2a and that of the mercury sump 6b, oil baths 10, 11 are respectively provided therefor which are each filled with a heat transfer oil or Si oil. Heat exchangers 13, 14 and temperature sensors 15, 16 are arranged respectively in the oil baths 10, 11, the sensors 15, 16 supplying signals indicative of the oil bath temperatures to respective first and second thermoregulators 17, 18. The thermoregulators 17, 18 have their outputs connected to the heat exchangers 13, 14, respectively, to carry out PID control so that the oil (and hence mercury in the sumps 2a, 6b) may be controlled to a predetermined temperature.

All the outer surfaces of the quartz tube 1 except for a portion (hereinafter referred to as "the entrance window") forming a wall of the electric discharge cell 6, a portion (hereinafter referred to as "the emission window") corresponding to the hole 3a of one of the cathode plates 3, and portions where the quartz tube 1 is in contact with the cathode plates 3, i.e. the outer surfaces of the part of the quartz tube 1 which is on the right side (as viewed in FIG. 1) of the right hole 3b of the other cathode plate 3 are coated with light screen coating 1a for preventing any light from entering the resonance cell 2 and any radiation from being emitted from the resonance cell 2, through the same part.

The process of emission of a monochromatic radiation by the thus constructed low-pressure mercury resonance radiation source is outlined as follows:

(1) Voltage of a few KV (e.g. 5 KV) is applied across the anode 5 and the cathode plates 3.

(2) The electric discharge cell 6 is filled with mercury vapor having a saturation vapor pressure corresponding to a set temperature T$_2$ controlled by the second thermoregulator 18, and an argon gas having the predetermined pressure. Upon application of the above voltage, plasma discharge occurs in the electric discharge cell 6.

(3) The plasma discharge causes a discharge-excited emission of radiations having various wavelengths including the mercury resonance line having a wavelength of 253.7 nm. The radiations enter the resonance cell 2 through the entrance window of the quartz tube 1.

(4) The resonance cell 2 is filled with mercury vapor having a saturation vapor pressure corresponding to a set temperature T$_1$ controlled by the first thermoregulator 17. Only the radiation or mercury resonance line with a wavelength of 253.7 nm is absorbed by the mercury vapor, and the radiation having the same wavelength is re-emitted and sent out of the emission window of the quartz tube 1.

(5) The outgoing radiation is supplied to a device for exposure etc. by way of an optical system, not shown, including an optical lens etc.

Figure 3:
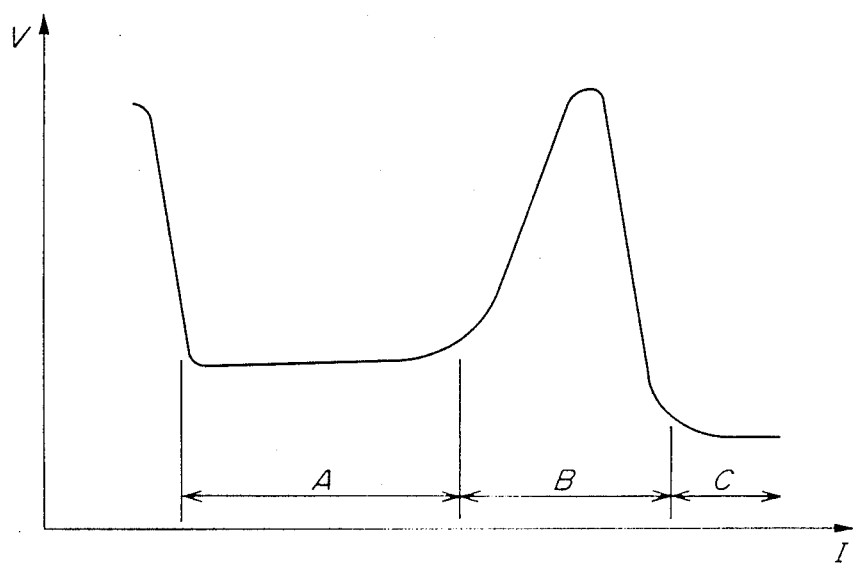
FIG. 3 is a diagram showing the relationship between the discharge current I and the voltage V across electrodes.

FIG. 3 shows the relationship between the discharge current I which flows through electric discharge occurring in the electric discharge cell 6 and the voltage V applied across the electrodes (anode and cathodes). At the start of the electric discharge, the applied voltage V rapidly decreases, and then even if the current I is increased, the voltage V hardly changes (A in FIG. 3; normal glow discharge region). If the current I is further increased, the voltage V rapidly increases and then rapidly decreases (B in FIG. 3; abnormal glow discharge region). If the current I is still further increased, arc discharge occurs (C in FIG. 3; arc discharge region).

In this embodiment, the discharge current I is controlled to the abnormal glow discharge region (B in FIG. 3) for the following reason:

In general, the greater the discharge current I, the more frequently electrons of mercury atoms are excited and then the atoms in the excited state return to the ground state through release of engergy or radiation, so that the emitted radiation or engergy is increased. However, in the arc discharge region, the voltage is extremely low, so that although the electron density of the current I is high the velocity of moving electrons is low, which results in decreased emission of radiation or energy. Further, in the arc discharge region, the temperature of electrodes is increased, so that undesired evaporation of cathode material is promoted, which causes additional emission of radiation caused by the evaporation of the electrode material to be included in the spectrum of the emitted radiation. Therefore, in this embodiment, the discharge current I is carefully controlled to lie within the regions A and B where the arc discharge (region C) does not occur. Optimum emitted radiation occurs when operation is confined to the abnormal glow discharge region B.

Figure 4:
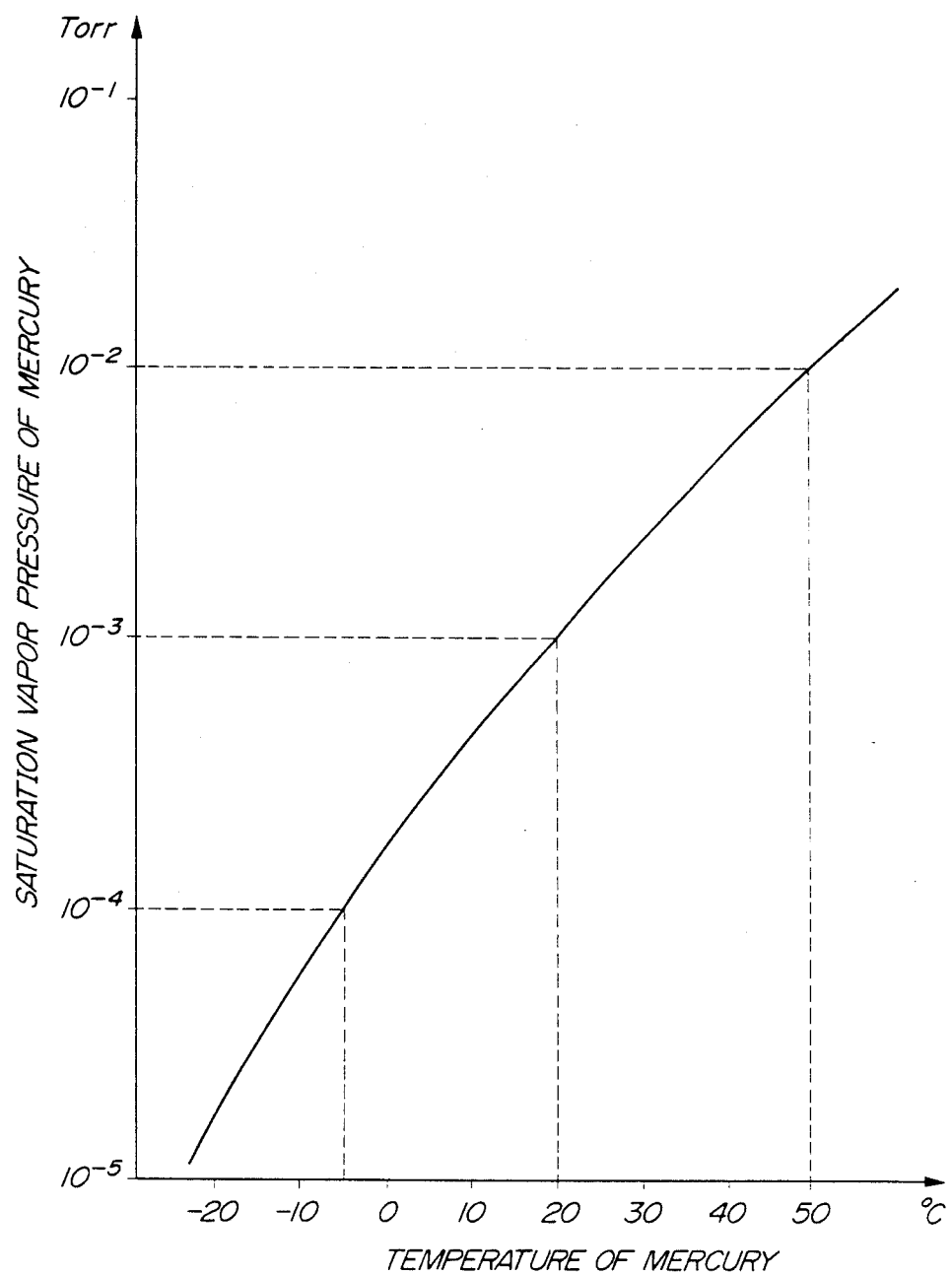
FIG. 4 is a diagram showing the relationship between the temperature of mercury and the saturation vapor pressure of mercury.

FIG. 4 shows the well established empirical relationship between the temperature of mercury and the saturation vapor pressure of mercury. For instance, if the temperature of mercury is set within a range of $-5°$ C. to $+20°$ C., the saturation vapor pressure of mercury will be within a range of $10^{-4}$ to $10^{-3}$ Torr. The saturation vapor pressure of mercury in the electric discharge cell 6 is controlled based on the relationship shown in FIG. 4. The saturation vapor pressure of mercury and the pressure of argon gas in the electric discharge cell 6 are set in the following manner:

(1) The pressure within the electric discharge cell 6 is reduced to a value within a range of $10^{-4}$ to $10^{-3}$ by the rotary pump 21b. The set temperature $T_2$ by the second thermoregulator 18 is set to not higher than $-10°$ C., to thereby set the mercury vapor pressure to a value not higher than $10^{-4}$ Torr.

(2) To establish an Ar-Hg electric discharge, argon gas is introduced into the electric discharge cell 6 to thereby set the total pressure within the cell 6 to a value within a range of $10^{-3}$ to $10^{-2}$ Torr.

(3) The set temperature $T_2$ by the second thermoregulator 18 is set to a value within a range of 20° C. to 50° C. to thereby set the mercury vapor pressure to a second predetermined value (e.g. $10^{-3}$ to $10^{-2}$ Torr).

This careful pressure control is required because if the mercury vapor pressure is higher than $10^{-2}$ Torr, emission spectra other than the mercury resonance line becomes relatively large so that the efficiency of the resonance radiation source is decreased, while if the mercury vapor pressure is lower than $10^{-3}$ Torr, there is a great possibility of the electric discharge not igniting, and even if the electric discharge does ignite, the intensity of the resonance line becomes lower.

As a consequence, the mercury vapor pressure within the electric discharge cell 6 is set to a value within the range of $10^{-3}$ to $10^{-2}$ Torr. By controlling the mercury vapor pressure in the electric discharge cell 6 to the second predetermined value as described above, it is possible to stabilize the discharge current and prevent the arc discharge from occurring. As a result, it is possible to prevent undesired erosion of the electrodes, and avoid the introduction of spectral emission associated with evaporation of electrode material in the spectra of the discharge-excited radiation.

Further, since the temperature of the electric discharge cell 6 and that of the resonance cell 2 are increased by the electric discharge, the electric discharge cell 6 and its neigbouring parts are cooled by the coolant tube 7 to thereby prevent change in the mercury vapor pressure due to increase in the temperature and the resulting change in the discharge conditions and hence change in the intensity of the emitted radiation, so that the radiation source may be stabilized.

Next, the setting of the mercury vapor pressure in the resonance cell 2 will be described. In the resonance cell 2, the resonance lines having a wavelength of 253.7 and 184.9 nm are strongly absorbed by the atomic mercury vapor, and then the radiation having the same wavelength is re-emitted (the excited elecrons return to the ground state). If the mercury vapor pressure in the resonance cell 2 is higher than $10^{-2}$ Torr, absorption and re-emission of the resonance lines occurs only in the peripheral region of the resonance cell 2, i.e. only in the region closer to the electric discharge cell 6, so that the intensity of the emitted radiation becomes lower in the central region. On the other hand, if the mercury vapor pressure is lower than $10^{-4}$ Torr, absorption of the resonance line hardly occurs, so that re-emission thereof hardly occurs. Therefore, in this embodiment, the mercury vapor pressure within the resonance cell 2 is controlled to a value within a range of $10^{-4}$ to $10^{-3}$ Torr (first predetermined value). This makes it possible to make uniform the intensity of the radiation throughout the whole resonance cell 2 and increase the output power of the whole radiation. The mercury vapor pressure within the resonance cell 2 is controlled to the first predetermined value by setting the set temperature $T_1$ by the thermoregulator 17 to a value within a range of 15° C. to 20° C. (see FIG. 4).

Figure 5:
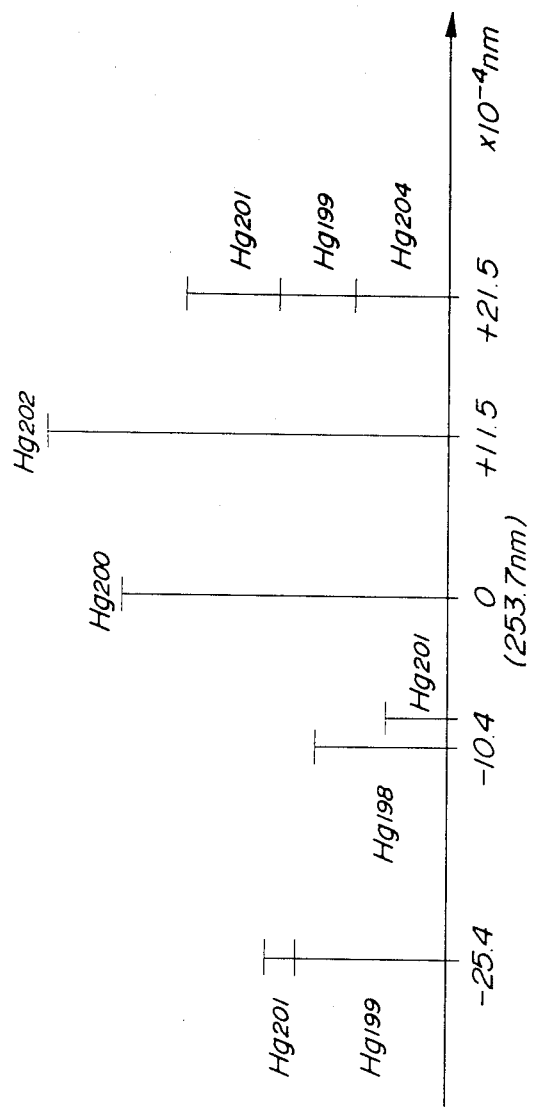
FIG. 5 is a diagram illustrating a hyperfine structure of the mercury resonance line (253.7 nm).

FIG. 5 shows the hyperfine structure of the resonance lines at wavelengths in the vicinity of 253.7 nm. Similar arguments can be made for the 184.9 nm resonance line of mercury. 0 of the abscissa corresponds to a wavelength of 253.7 nm, and $+11.5$ and $-10.4$ correspond to wavelengths of $(253.7+11.5\times10^{-4})$ nm and $(253.7-10.4\times10^{-4})$ nm, respectively, and so on. The ordinate indicates the relative intensity of radiation. Further, $Hg_{200}$, $Hg_{202}$, etc. indicate isotopic elements of mercury (200, 202, etc. are mass numbers). For instance, $Hg_{200}$ emits a resonance line having a wavelength of 253.7 nm, and $Hg_{202}$ a resonance line having a wavelength of $(253.7+11.5\times10^{-4})$ nm. The sum of the relative intensities of these two resonance lines is 53.04% (provided that the total of all the radiant energy values of the isotopic elements shown in FIG. 5 is 100%). Therefore, in this embodiment, $Hg_{200}$ and $Hg_{202}$ are contained in the mercury sump 2a of the resonance cell 2 to thereby obtain a source for radiation with both high luminance and high monochromaticity (high resolution). Naturally, if either $Hg_{200}$ or $Hg_{202}$ alone is employed, there may be obtained a radiation source with higher monochromaticity which is suitable for more exact optical measurement; however, the intensity of the radiation is reduced approximately by half. In contrast, when both $Hg_{200}$ and $Hg_{202}$ are employed, even if a width of $\pm 5 \times 10^{-4}$ nm which each resonance line has is taken into consideration, the combined spectrum is in a wavelength variation range width of 21.5 $(=5+11.5+5)\times 10^{-4}$ nm. This narrow band radiation is monochromatic enough to satisfy the normally-demanded variation range width, i.e. $30 \times 10^{-4}$ nm for acceptable chromatic aberration in an optical lens system. At the same time, the intensity of the radiation using the two resonance lines is approximately twice as high as that using a single resonance line, so that a source of radiation with high intensity and high monochromaticity can be obtained.

The required diameter D of the quartz tube 1 is calculated by the following equation:

$$D = 1/k_0 \quad (1)$$

$$K_0 = \frac{2}{\Delta v_D} \sqrt{\frac{\ln 2}{\pi}} \frac{\lambda_0}{8\pi} \frac{g_2}{g_1} \frac{N}{\tau} \quad (2)$$

where $k_0$ represents an absorption coefficient of the gas, $\Delta v_D$ a Doppler width (constant), $\lambda_0$ a wavelength at the center of the resonance line, $g_1$ and $g_2$ a statistical weight of the excited state and that of the ground state, respectively, N a number of mercury atoms per unit volume (which corresponds to mercury vapor pressure P), and $\tau$ an average duration of the excited state of a mercury atom.

As can be seen from the equation (2), $k_0$ is directly proportional to the number N of the mercury atoms and hence the mercury vapor pressure P. Therefore, the diameter D of the quartz tube is preferably determined such that the diameter D is inversely proportional to the mercury vapor pressure P. In other words, the mercury vapor pressure P and the tube diameter D should be set such that their values satisfy the relationship expressed by the Equations (1) and (2). This makes it possible to obtain a more uniform radiation versus radial position. That is without the intensity of part of the radiation emitted at the center of the quartz tube 1 being decreased to that at large radius values.

Although the resonance line having a wavelength of 253.7 nm is utilized in this embodiment, we emphasize that the resonance line having a wavelength of 184.9 nm may also be utilized in the case where the radiation is not transmitted through the air but is used in vacuum or in an inert gas (the resonance line with the wavelength of 184.9 nm is absorbed by the oxygen in the ambient air).

As described in detail hereinabove, according to the present invention, there can be obtained a radiation source which emits a radiation which is both stabilized in intensity and high in monochromaticity. More specifically, a resonance radiation having a wavelength of approximately 250 nm can be obtained which has its spectrum width (energy half-width) reduced to less than approximately 0.003 nm, which makes it possible to ignore chromatic aberration occurring in the optical system. As a result, the radiation source according to the invention is suitable for lithography in which high resolution is required.

What is claimed is:

1. In a low-pressure mercury resonance radiation source including a discharge lamp containing mercury vapor and producing broad band radiation directly emitted form said mercury vapor through excitation of same by electric discharge, a resonance cell containing mercury vapor and disposed adjacent said discharge lamp for absorbing said broad band radiation and subsequently emitting narrow band mercury resonance radiation, and first pressure control means for controlling pressure of said mercury vapor within said resonance cell to a first predetermined value, the improvement comprising:

second pressure control means for controlling pressure of said mercury vapor within said discharge lamp to a second predetermined value, thereby stabilizing the discharge current and preventing arcing.

2. A low-pressure mercury resonance radiation source according to claim 1, wherein said first pressure control means comprises a first mercury sump arranged within said resonance cell, and first temperature control means for controlling temperature of said first mercury sump, and said second pressure control means comprises a side tube communicating with said discharge lamp, a second mercury sump arranged in said side tube, and second temperature control means for controlling temperature of said second mercury sump.

3. A low-pressure mercury resonance radiation source according to claims 1 or 2, wherein said resonance cell is substantially in the form of a hollow cylinder, said first predetermined value of the pressure of said mercury vapor being determined in accordance with an inner diameter of said hollow cylinder.

4. A low-pressure mercury resonance radiation source according to claims 1 or 2, wherein said first predetermined value of the pressure of said mercury vapor is in a range of $10^{-4}$ to $10^{-3}$ Torr, and said second predetermined value of the pressure of said mercury vapor is in a range of $10^{-3}$ to $10^{-2}$ Torr.

5. A low-pressure mercury resonance radiation source according to claims 1 or 2, wherein said mercury vapor within said resonance cell comprises mercury atoms having a mass number of 200 and mercury atoms having a mass number of 202.

6. A low-pressure mercury resonance radiation source comprising:

a pair of cathode plates opposed to each other and each having a through hole formed in a central portion thereof;

a first tube extending through said through holes of said cathode plates and defining a resonance cell therein, said resonance cell containing mercury vapor having a first predetermined pressure;

an anode interposed between said cathode plates and insulated from said cathode plates, said anode surrounding said first tube in spaced relation thereto, said anode defining an electric discharge chamber together with said cathode plates and said first tube, said electric discharge chamber containing mercury vapor having a second predetermined pressure, thereby stabilizing the discharge current and preventing arcing; and a power source for applying voltage across said anode and said cathode plates.

7. A low-pressure mercury resonance radiation source according to claim 6, including a first mercury sump formed within said resonance cell, a side tube communicating with said electric discharge lamp, said side tube having a second mercury sump, first temperature control means for controlling temperature of said first mercury sump, and second temperature control means for controlling temperature of said second mercury sump.

8. A low-pressure mercury resonance radiation source according to claims 6 or 7, including a coolant tube arranged around said anode.

9. A low-pressure mercury resonance radiation source according to claims 6 or 7, wherein said first tube has all outer surfaces thereof coated with light screen coating, except for a portion thereof defining said electric discharge chamber, a portion thereof corresponding to said through hole of one of said cathode plates, through which a resonance radiation is sent out, and portions thereof in contact with said cathode plates.

* * * * *